(12) United States Patent
Nodera et al.

(10) Patent No.: US 8,080,477 B2
(45) Date of Patent: Dec. 20, 2011

(54) FILM FORMATION APPARATUS AND METHOD FOR USING SAME

(75) Inventors: Nobutake Nodera, Nirasaki (JP); Jun Sato, Nirasaki (JP); Masanobu Matsunaga, Nirasaki (JP); Kazuhide Hasebe, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 542 days.

(21) Appl. No.: 12/285,513

(22) Filed: Oct. 7, 2008

(65) Prior Publication Data

US 2009/0117743 A1 May 7, 2009

(30) Foreign Application Priority Data

Oct. 11, 2007 (JP) ................................. 2007-265327

(51) Int. Cl.
*H01L 21/461* (2006.01)
*H01L 21/331* (2006.01)
*C23C 16/452* (2006.01)

(52) U.S. Cl. ............. 438/694; 438/706; 134/1; 134/1.1; 134/1.3; 134/19; 118/723 MP; 257/E21.483; 257/E21.294

(58) Field of Classification Search .................. 438/694, 438/706; 257/E21.483, E21.294; 134/1, 134/1.1, 1.3, 19; 118/723 MP
See application file for complete search history.

(56) References Cited

U.S. PATENT DOCUMENTS

| 6,242,347 | B1 | 6/2001 | Vasudev et al. |
| 7,494,943 | B2 | 2/2009 | Noro et al. |
| 7,938,080 | B2 | 5/2011 | Noro et al. |
| 2001/0027030 | A1 * | 10/2001 | Vasudev et al. ............... 438/784 |
| 2005/0279454 | A1 * | 12/2005 | Snijders .................... 156/345.29 |
| 2006/0081182 | A1 * | 4/2006 | Okada et al. .................. 118/715 |
| 2008/0142046 | A1 * | 6/2008 | Johnson et al. ................. 134/19 |

FOREIGN PATENT DOCUMENTS

| CN | 1958878 A | 5/2007 |
| JP | 3-293726 | 12/1991 |
| JP | 10-156172 | 6/1998 |
| KR | 1999-014078 | 2/1999 |

OTHER PUBLICATIONS

Nobutaka Nodera, et al.; Film Formation Apparatus for Semiconductor Process.
Chinese Office Action issued on May 18, 2011 for Application No. 200810179942.5 with English translation.
Korean Office Action issued on Jul. 11, 2011 for Application No. 10-2008-0099370 w/ English language translation.

* cited by examiner

*Primary Examiner* — Nadine G Norton
*Assistant Examiner* — Mahmoud Dahimene
(74) *Attorney, Agent, or Firm* — Smith, Gambrell & Russell, LLP (57) ABSTRACT

A method for using a film formation apparatus for a semiconductor process to form a thin film on a target substrate inside a reaction chamber includes performing a cleaning process to remove a by-product film deposited on a predetermined region in a gas route from a film formation gas supply system, which supplies a film formation gas contributory to film formation, through the reaction chamber to an exhaust system, by alternately repeating an etching step and an exhaust step a plurality of times in a state where the reaction chamber does not accommodate the target substrate. The etching step includes supplying a cleaning gas in an activated state for etching the by-product film onto the predetermined region, thereby etching the by-product film. The exhaust step includes stopping supply of the cleaning gas and exhausting gas by the exhaust system from a space in which the predetermined region is present.

12 Claims, 6 Drawing Sheets

FILM FORMATION APPARATUS AND METHOD FOR USING SAME

BACKGROUND OF THE INVENTION

1. Field of the Invention

The present invention relates to a film formation apparatus for a semiconductor process for forming a thin film, such as a silicon nitride film, on a target substrate, such as a semiconductor wafer, and also to a method for using the apparatus. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or a glass substrate used for an FPD (Flat Panel Display), e.g., an LCD (Liquid Crystal Display), by forming semiconductor layers, insulating layers, and conductive layers in predetermined patterns on the target substrate.

2. Description of the Related Art

In manufacturing semiconductor devices, a process, such as CVD (Chemical Vapor Deposition), is performed to form a thin film, such as a silicon nitride film or silicon oxide film, on a target substrate, such as a semiconductor wafer. For example, a film formation process of this kind is arranged to form a thin film on a semiconductor wafer, as follows.

At first, the interior of the reaction tube (reaction chamber) of a heat-processing apparatus is heated by a heater at a predetermined load temperature, and a wafer boat that holds a plurality of semiconductor wafers is loaded. Then, the interior of the reaction tube is heated up to a predetermined process temperature, and gas inside the reaction tube is exhausted through an exhaust port, so that the pressure inside the reaction tube is decreased to a predetermined pressure.

Then, while the interior of the reaction tube is kept at the predetermined temperature and pressure (kept exhausted), a film formation gas is supplied through a gas supply line into the reaction tube. For example, in the case of CVD, when a film formation gas is supplied into a reaction tube, the film formation gas causes a thermal reaction and thereby produces reaction products. The reaction products are deposited on the surface of each semiconductor wafer, and form a thin film on the surface of the semiconductor wafer.

Reaction products generated during the film formation process are deposited (adhered) not only on the surface of the semiconductor wafer, but also on, e.g., the inner surface of the reaction tube and other members, the latter being as by-product films. If the film formation process is continued while by-product films are present on the inner surface of the reaction tube and so forth, a stress is generated and causes peeling of some of the by-product films and the quartz of the reaction tube and so forth due to a difference in coefficient of thermal expansion between the quartz and by-product films. Consequently, particles are generated, and may decrease the yield of semiconductor devices to be fabricated and/or deteriorate some components of the processing apparatus.

In order to solve this problem, cleaning of the interior of the reaction tube is performed after the film formation process is repeated several times. In this cleaning, the interior of the reaction tube is heated at a predetermined temperature by a heater, and a cleaning gas, such as a mixture gas of fluorine and a halogen-containing acidic gas, is supplied into the reaction tube. The by-product films deposited on the inner surface of the reaction tube and so forth are thereby dry-etched and removed by the cleaning gas (for example, Jpn. Pat. Appln. KOKAI Publication No. 3-293726). However, as described later, the present inventors have found that conventional methods including a cleaning process for using a film formation apparatus of this kind have room for improvement in terms of some characteristics of the apparatus concerning the throughput and particle generation.

BRIEF SUMMARY OF THE INVENTION

An object of the present invention is to provide a film formation apparatus for a semiconductor process and a method for using the same, which can improve characteristics of the apparatus concerning the throughput and particle generation.

According to a first aspect of the present invention, there is provided a method for using a film formation apparatus for a semiconductor process to form a thin film on a target substrate inside a reaction chamber, the method comprising: performing a cleaning process to remove a by-product film deposited on a predetermined region in a gas route from a film formation gas supply system, which supplies a film formation gas contributory to film formation, through the reaction chamber to an exhaust system, by alternately repeating an etching step and an exhaust step a plurality of times in a state where the reaction chamber does not accommodate the target substrate, wherein the etching step includes supplying a cleaning gas in an activated state for etching the by-product film onto the predetermined region, thereby etching the by-product film, and the exhaust step includes stopping supply of the cleaning gas and exhausting gas by the exhaust system from a space in which the predetermined region is present.

According to a second aspect of the present invention, there is provided a method for using a film formation apparatus for a semiconductor process, the film formation apparatus comprising a reaction chamber configured to accommodate a plurality of target substrates at intervals in a vertical direction, a support member configured to support the target substrates inside the reaction chamber, an exhaust system configured to exhaust gas from inside the reaction chamber, a heater disposed around the reaction chamber to heat the target substrates, a first film formation gas supply system configured to supply a first film formation gas containing a silane family gas into the reaction chamber, a second film formation gas supply system configured to supply a second film formation gas containing a nitriding gas into the reaction chamber, a plasma generation section attached outside the reaction chamber and forming a plasma generation space communicating with a process space inside the reaction chamber, the second film formation gas being supplied through the plasma generation space into the process space, and a cleaning gas supply system configured to supply a cleaning gas containing fluorine gas for etching a by-product film generated by a reaction between the first and second film formation gases and deposited inside the plasma generation section, the method comprising: performing a film formation process for forming a silicon nitride film by CVD on the target substrates inside the reaction chamber, by supplying the first film formation gas into the reaction chamber and supplying the second film formation gas into the reaction chamber while activating the second film formation gas by the plasma generation section; and then, performing a cleaning process to remove a by-product film deposited inside the plasma generation section, in a state where the reaction chamber does not accommodate the target substrates, the cleaning process comprising alternately repeating an etching step and an exhaust step a plurality of times, wherein the etching step includes supplying the cleaning gas in an activated state into the plasma generation section, thereby etching the by-product film, and the exhaust step includes stopping supply of the cleaning gas and exhausting gas by the exhaust system from inside the plasma generation section.

According to a third aspect of the present invention, there is provided a film formation apparatus for a semiconductor process, the apparatus comprising: a reaction chamber configured to accommodate a plurality of target substrates at intervals in a vertical direction; a support member configured to support the target substrates inside the reaction chamber; an exhaust system configured to exhaust gas from inside the reaction chamber; a heater disposed around the reaction chamber to heat the target substrates; a first film formation gas supply system configured to supply a first film formation gas containing a silane family gas into the reaction chamber; a second film formation gas supply system configured to supply a second film formation gas containing a nitriding gas into the reaction chamber; a plasma generation section attached outside the reaction chamber and forming a plasma generation space communicating with a process space inside the reaction chamber, the second film formation gas being supplied through the plasma generation space into the process space; a cleaning gas supply system configured to supply a cleaning gas containing fluorine gas for etching a by-product film generated by a reaction between the first and second film formation gases and deposited inside the plasma generation section; and a control section configured to control an operation of the apparatus, the control section being preset to conduct a method that comprises performing a film formation process for forming a silicon nitride film by CVD on the target substrates inside the reaction chamber, by supplying the first film formation gas into the reaction chamber and supplying the second film formation gas into the reaction chamber while activating the second film formation gas by the plasma generation section, and then, performing a cleaning process to remove a by-product film deposited inside the plasma generation section, in a state where the reaction chamber does not accommodate the target substrates, the cleaning process comprising alternately repeating an etching step and an exhaust step a plurality of times, wherein the etching step includes supplying the cleaning gas in an activated state into the plasma generation section, thereby etching the by-product film, and the exhaust step includes stopping supply of the cleaning gas and exhausting gas by the exhaust system from inside the plasma generation section.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

In the process of developing the present invention, the inventors studied problems with regard to conventional methods for using a film formation apparatus for a semiconductor process, where the methods include a cleaning process for a reaction chamber. As a result, the inventors have arrived at the findings given below.

Specifically, film formation apparatuses of this kind entail deposition of by-product films in the gas route from a film formation gas supply system, which supplies a film formation gas contributory to film formation, through the reaction chamber to an exhaust system. However, the deposition of by-product films is caused in different amounts depending on positions in the gas route. Further, the composition of by-product films (reaction products) varies to some extent depending on positions in the gas route. For example, in a film formation apparatus including a plasma generation section connected to the reaction chamber to turn a film formation gas into plasma, where a first film formation gas containing a silane family gas is directly supplied into the reaction chamber and a second film formation gas containing a nitriding gas is supplied through the plasma generation section into the reaction chamber, a by-product film having a composition different to some extent from that of the original silicon nitride film tends to be deposited near the exit of the plasma generation section.

The conventional methods with a cleaning process for using a film formation apparatus, as disclosed in Jpn. Pat. Appln. KOKAI Publication No. 3-293726 set out above, are arranged to manage the apparatus without reference to the issues described above. In this respect, where the management of the apparatus is preset to include a local cleaning process selectively performed on a portion at which a by-product film is easily deposited, the following advantages are obtained. Specifically, the frequency of performing an entire cleaning process for the entirety inside the reaction chamber can be set lower by use of the local cleaning process. Accordingly, if the local cleaning process is efficiently performed in a short time, the throughput of the apparatus is improved. In addition, the local cleaning process can be arranged to set the cleaning gas composition and process conditions in accordance with the target by-product film. Consequently, this by-product film is reliably removed, and the particle generation is thereby suppressed.

An embodiment of the present invention achieved on the basis of the findings given above will now be described with reference to the accompanying drawings. In the following description, the constituent elements having substantially the same function and arrangement are denoted by the same reference numerals, and a repetitive description will be made only when necessary.

Figure 1:
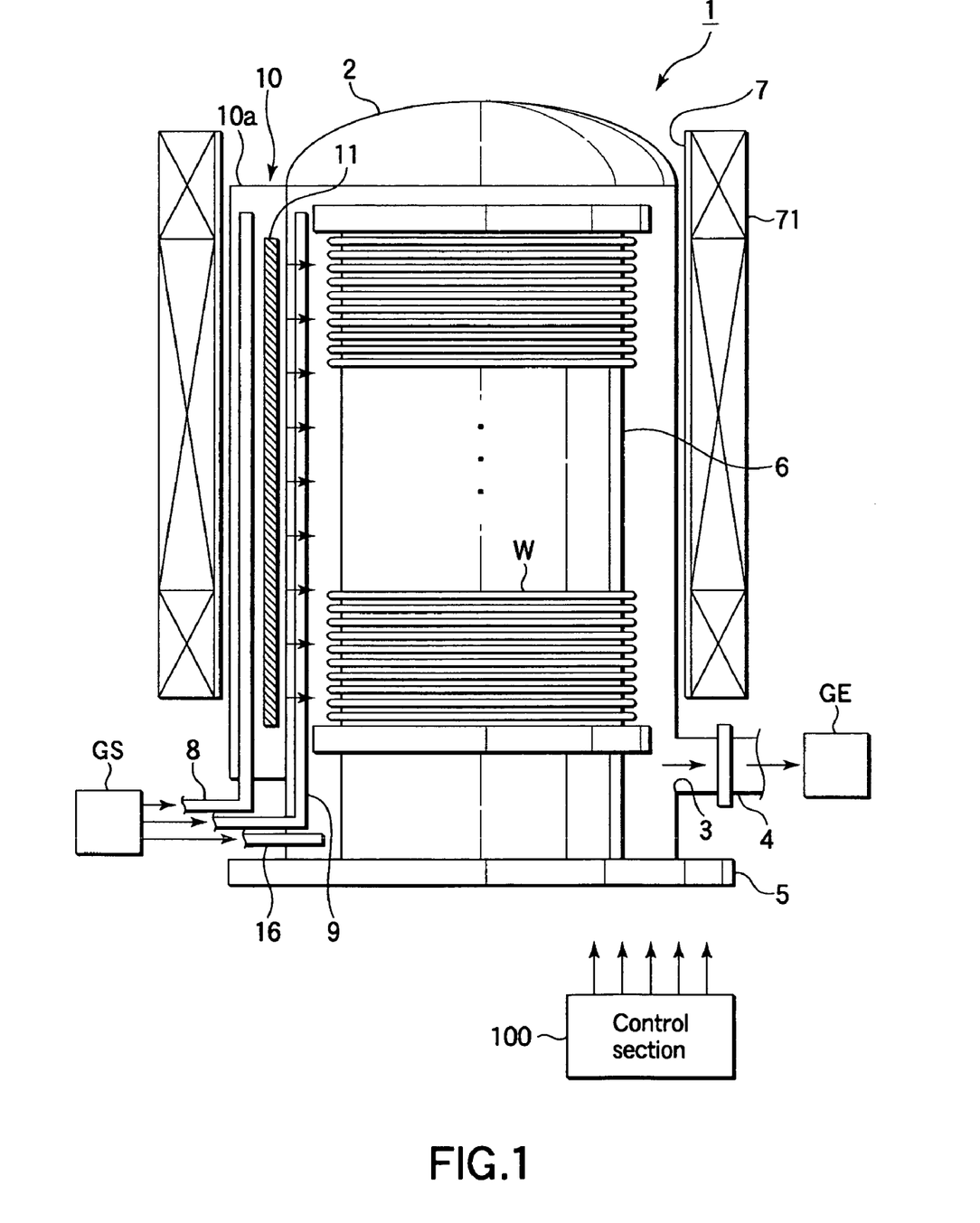
FIG. 1 is a sectional view showing a film formation apparatus (vertical CVD apparatus) according to an embodiment of the present invention.
Figure 2:
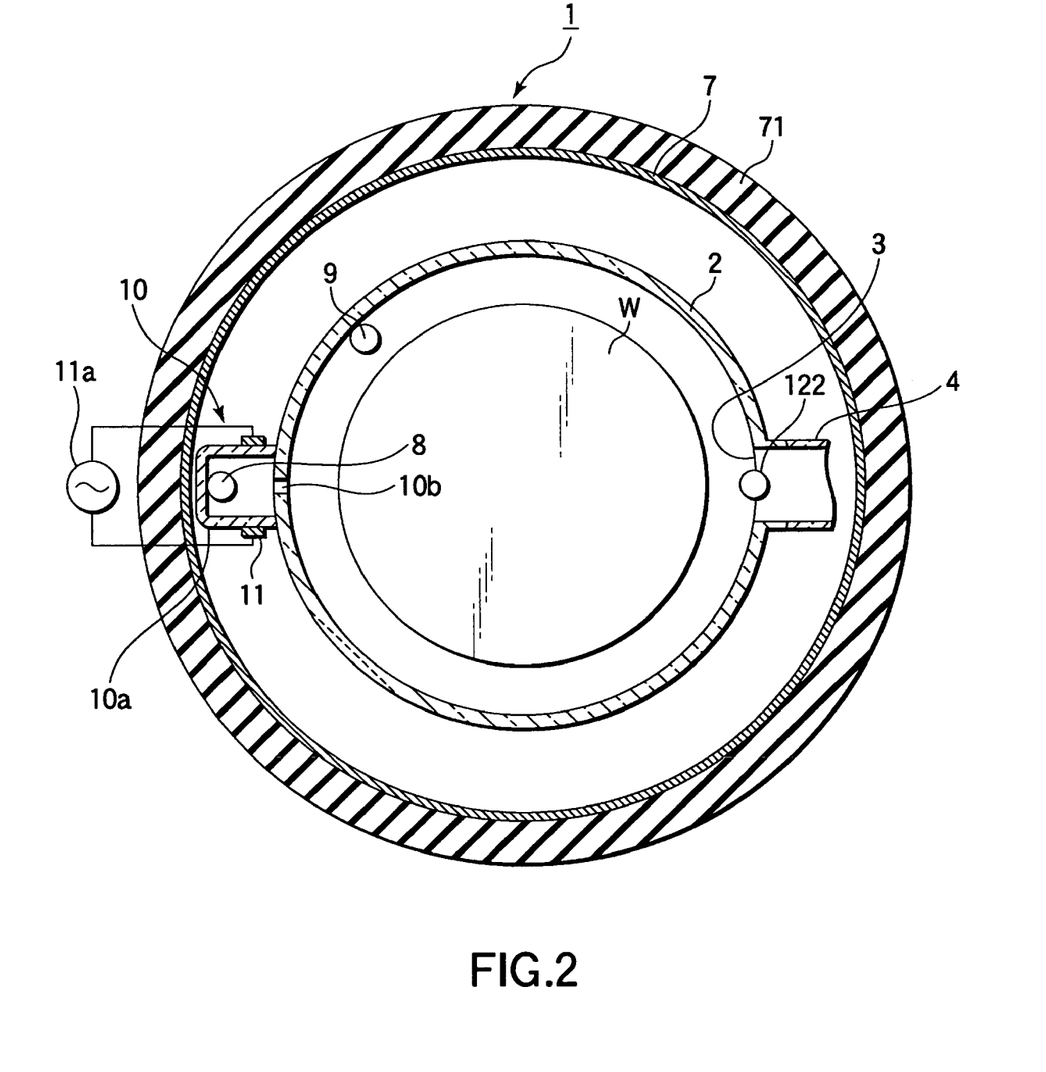
FIG. 2 is a sectional plan view showing part of the apparatus shown in FIG. 1.

FIG. 1 is a sectional view showing a film formation apparatus (vertical CVD apparatus) according to an embodiment of the present invention. FIG. 2 is a sectional plan view showing part of the apparatus shown in FIG. 1. This film formation apparatus is structured as a vertical processing apparatus of the batch type for forming a silicon nitride film on a plurality of wafers W by MLD (Molecular Layer Deposition).

As shown in FIG. 1, the film formation apparatus 1 includes an essentially cylindrical reaction tube (reaction chamber) 2 arranged such that its top is closed and the longitudinal direction is set in the vertical direction. The reaction tube 2 is made of a heat-resistant and corrosion-resistant material, such as quartz.

The reaction tube 2 has an exhaust port 3 formed on the sidewall near the bottom, for exhausting gas from inside the reaction tube 2. The exhaust port 3 is connected to an exhaust section GE through an airtight exhaust line 4. The exhaust section GE has a pressure adjusting mechanism including, e.g., a valve and a vacuum exhaust pump (not shown in FIG. 1, but shown in FIG. 3 with a reference symbol 127). The exhaust section GE is used to exhaust the atmosphere within the reaction tube 2, and set it at a predetermined pressure (vacuum level).

A lid 5 is disposed below the reaction tube 2. The lid 5 is made of a heat-resistant and corrosion-resistant material, such as quartz. The lid 5 is moved up and down by a boat elevator described later (not shown in FIG. 1, but shown in FIG. 3 with a reference symbol 128). When the lid 5 is moved up by the boat elevator, the bottom of the reaction tube 2 (load port) is closed. When the lid 5 is moved down by the boat elevator, the bottom of the reaction tube 2 (load port) is opened.

A wafer boat 6 made of, e.g., quartz is placed on the lid 5. The wafer boat 6 is configured to hold a plurality of semiconductor wafers W at predetermined intervals in the vertical direction. A thermally insulating cylinder may be disposed on the lid 5 to prevent the temperature inside the reaction tube 2 from being lowered due to the load port of the reaction tube 2. Further, a rotary table may be disposed to rotatably mount thereon the wafer boat 6 that holds semiconductor wafers W. In this case, the temperature of the semiconductor wafers W placed on the wafer boat 6 can be more uniform.

The reaction tube 2 is surrounded by a thermally insulating cover 71 and a heater 7 made of, e.g., a resistive heating body is disposed on the inner surface of the cover 71. The interior of the reaction tube 2 is heated by the heater 7, so that the semiconductor wafers W are heated up (increase in temperature) to a predetermined temperature.

Gas distribution nozzles 8 and 9 and a gas nozzle 16 penetrate the sidewall of the reaction tube 2 near the bottom, and are used for supplying process gases (such as film formation gases, a cleaning gas, and an inactive gas for dilution, purge, or pressure control) into the reaction tube 2. Each of the gas distribution nozzles 8 and 9 and gas nozzle 16 is connected to a process gas supply section GS through a mass-flow controller (MFC) and so forth (not shown). The process gas supply section GS includes gas sources of reactive gases and a gas source of nitrogen ($N_2$) gas used as an inactive gas, so as to prepare film formation gases and a cleaning gas, as follows.

Specifically, in this embodiment, in order to form a silicon nitride film (product film) on semiconductor wafers W by CVD, a first film formation gas containing a silane family gas and a second film formation gas containing a nitriding gas are used. In this embodiment, the silane family gas is dichlorosilane (DCS: $SiH_2Cl_2$) gas and the nitriding gas is ammonia ($NH_3$) gas. Each of the first and second film formation gases may be mixed with a suitable amount of carrier gas (dilution gas, such as $N_2$ gas), as needed. However, such a carrier gas will not be mentioned, hereinafter, for the sake of simplicity of explanation.

As a cleaning gas for etching a by-product film which contains silicon nitride as the main component (it means 50% or more), a halogen-containing acidic gas or a mixture gas of a halogen gas and hydrogen gas is used. In this embodiment, the cleaning gas is a mixture gas of fluorine ($F_2$) gas and nitrogen gas used as a dilution gas.

The gas distribution nozzle 8 is connected to gas sources of $NH_3$ gas, $F_2$ gas, and $N_2$ gas, the gas distribution nozzle 9 is connected to gas sources of DCS gas and $N_2$ gas, and the gas nozzle 16 is connected to a gas source of $N_2$ gas. Each of the gas distribution nozzles 8 and 9 is formed of a quartz pipe which penetrates the sidewall of the reaction tube 2 from the outside and then turns and extends upward (see FIG. 1). Each of the gas distribution nozzles 8 and 9 has a plurality of gas spouting holes, each set of holes being formed at predetermined intervals in the longitudinal direction (the vertical direction) over all the wafers W on the wafer boat 6. Each set of the gas spouting holes delivers the corresponding process gas almost uniformly in the horizontal direction, so as to form gas flows parallel with the wafers W on the wafer boat 6. On the other hand, the gas nozzle 16 used only for the inactive gas is formed of a short gas nozzle, which penetrates the sidewall of the reaction tube 2 from the outside.

A plasma generation section 10 is attached to the sidewall of the reaction tube 2 and extends in the vertical direction. The plasma generation section 10 has a vertically long narrow opening 10b formed by cutting a predetermined width of the sidewall of the reaction tube 2, in the vertical direction. The opening 10b is covered with a quartz cover 10a airtightly connected to the outer surface of the reaction tube 2 by welding. The cover 10a has a vertically long narrow shape with a concave cross-section, so that it projects outward from the reaction tube 2.

With this arrangement, the plasma generation section 10 is formed such that it projects outward from the sidewall of the reaction tube 2 and is opened on the other side to the interior of the reaction tube 2. In other words, the inner space of the plasma generation section 10 communicates with the process space within the reaction tube 2. The opening 10b has a vertical length sufficient to cover all the wafers W on the wafer boat 6 in the vertical direction.

A pair of long narrow electrodes 11 are disposed on the opposite outer surfaces of the cover 10a, and face each other while extending in the longitudinal direction (the vertical direction). The electrodes 11 are connected to an RF (Radio Frequency) power supply 11a for plasma generation, through feed lines. An RF voltage of, e.g., 13.56 MHz is applied to the electrodes 11 to form an RF electric field for exciting plasma between the electrodes 11. The frequency of the RF voltage is not limited to 13.56 MHz, and it may be set at another frequency, e.g., 400 kHz.

The gas distribution nozzle 8 of the second film formation gas is bent outward in the radial direction of the reaction tube 2, at a position lower than the lowermost wafer W on the wafer boat 6. Then, the gas distribution nozzle 8 vertically extends at the deepest position (the farthest position from the center of the reaction tube 2) in the plasma generation section 10. As shown also in FIG. 2, the gas distribution nozzle 8 is separated outward from an area sandwiched between the pair of electrodes 11 (a position where the RF electric field is most intense), i.e., a plasma generation area where the main plasma is actually generated. The second film formation gas comprising $NH_3$ gas is spouted from the gas spouting holes of the gas distribution nozzle 8 toward the plasma generation area. Then, the second film formation gas is excited (decomposed or activated) in the plasma generation area, and is supplied in this state with radicals containing nitrogen atoms (N*, NH*, NH$_2$*, NH$_3$*) onto the wafers W on the wafer boat 6 (the symbol [*] denotes that it is a radical). On the other hand, the cleaning gas is supplied from the gas distribution nozzle 8, but it is not turned into plasma (or activated) by the plasma generation section 10.

At a position near and outside the opening 10b of the plasma generation section 10, the gas distribution nozzle 9 of the first film formation gas is disposed. The gas distribution nozzle 9 extends vertically upward on one side of the outside of the opening 10b (inside the reaction tube 2). The first film formation gas comprising DCS gas is spouted from the gas spouting holes of the gas distribution nozzle 9 toward the center of the reaction tube 2.

A plurality of temperature sensors 122, such as thermocouples, for measuring the temperature inside the reaction tube 2 and a plurality of pressure gages (not shown in FIG. 1, but shown in FIG. 3 with a reference symbol 123) for measuring the pressure inside the reaction tube 2 are disposed inside the reaction tube 2.

Figure 3:
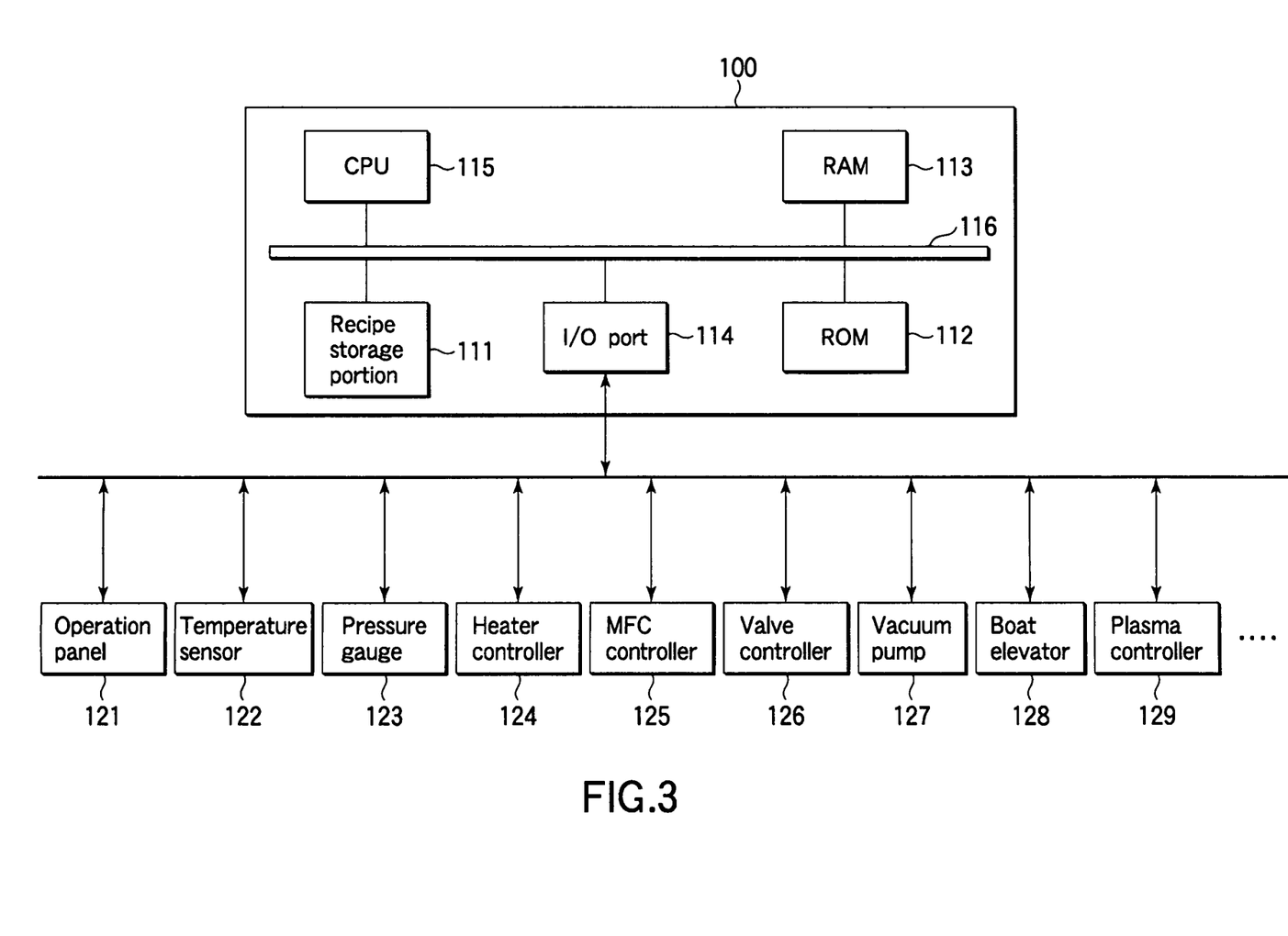
FIG. 3 is a view showing the structure of the control section of the apparatus shown in FIG. 1.

The film formation apparatus 1 further includes a control section 100 for controlling respective portions of the apparatus. FIG. 3 is a view showing the structure of the control section 100. As shown in FIG. 3, the control section 100 is connected to an operation panel 121, (a group of) temperature sensors 122, (a group of) pressure gages 123, a heater controller 124, MFC controllers 125, valve controllers 126, a vacuum pump 127, a boat elevator 128, a plasma controller 129, and so forth.

The operation panel 121 includes a display screen and operation buttons, and is configured to transmit operator's instructions to the control section 100, and show various data transmitted from the control section 100 on the display screen. The (group of) temperature sensors 122 are configured to measure the temperature at respective portions inside the reaction tube 2, exhaust line 4, and so forth, and to transmit measurement values to the control section 100. The (group of) pressure gages 123 are configured to measure the pressure at respective portions inside the reaction tube 2, exhaust line 4, and so forth, and to transmit measurement values to the control section 100.

The heater controller 124 is configured to control the heater 7. The heater controller 124 turns on the heater to generate heat in accordance with instructions from the control section 100. Further, the heater controller 124 measures the power consumption of the heater, and transmits it to the control section 100.

The MFC controllers 125 are configured to respectively control the MFCs (not shown) disposed on the gas distribution nozzles 8 and 9 and the gas nozzle 16. The MFC controllers 125 control the flow rates of gases flowing through the MFCs in accordance with instructions from the control section 100. Further, the MFC controllers 125 measure the flow rates of gases flowing through the MFCs, and transmit them to the control section 100.

The valve controllers 126 are respectively disposed on piping lines and configured to control the opening rate of valves disposed on piping lines in accordance with instructed values received from the control section 100. The vacuum pump 127 is connected to the exhaust line 4 and configured to exhaust gas from inside the reaction tube 2.

The boat elevator 128 is configured to move up the lid 5, so as to load the wafer boat 6 (semiconductor wafers W) into the reaction tube 2. The boat elevator 128 is also configured to move the lid 5 down, so as to unload the wafer boat 6 (semiconductor wafers W) from the reaction tube 2.

The plasma controller 129 is configured to control the plasma generation section 10 in accordance with instructions from the control section 100, so that ammonia supplied into the plasma generation section 10 is activated to generate ammonia radicals.

The control section 100 includes a recipe storage portion 111, a ROM 112, a RAM 113, an I/O port 114, and a CPU 115. These members are inter-connected via a bus 116 so that data can be transmitted between them through the bus 116.

The recipe storage portion 111 stores a setup recipe and a plurality of process recipes. After the film formation apparatus 1 is manufactured, only the setup recipe is initially stored. The setup recipe is executed when a thermal model or the like for a specific film formation apparatus is formed. The process recipes are prepared respectively for heat processes to be actually performed by a user. Each process recipe prescribes temperature changes at respective portions, pressure changes inside the reaction tube 2, start/stop timing for supply of process gases, and supply rates of process gases, from the time semiconductor wafers W are loaded into the reaction tube 2 to the time processed wafers W are unloaded.

The ROM 112 is a storage medium formed of an EEPROM, flash memory, or hard disc, and is used to store operation programs executed by the CPU 115 or the like. The RAM 113 is used as a work area for the CPU 115.

The I/O port 114 is connected to the operation panel 121, temperature sensors 122, pressure gages 123, heater controller 124, MFC controllers 125, valve controllers 126, vacuum pump 127, boat elevator 128, and plasma controller 129, and is configured to control output/input of data or signals.

The CPU (Central Processing Unit) 115 is the hub of the control section 100. The CPU 115 is configured to run control programs stored in the ROM 112, and control an operation of the film formation apparatus 1, in accordance with a recipe (process recipe) stored in the recipe storage portion 111, following instructions from the operation panel 121. Specifically, the CPU 115 causes the (group of) temperature sensors 122, (group of) pressure gages 123, and MFC controllers 125 to measure temperatures, pressures, and flow rates at respective portions inside the reaction tube 2, exhaust line 4, and so forth. Further, the CPU 115 outputs control signals, based on measurement data, to the heater controller 124, MFC controllers 125, valve controllers 126, and vacuum pump 127, to control the respective portions mentioned above in accordance with a process recipe.

Figure 4:
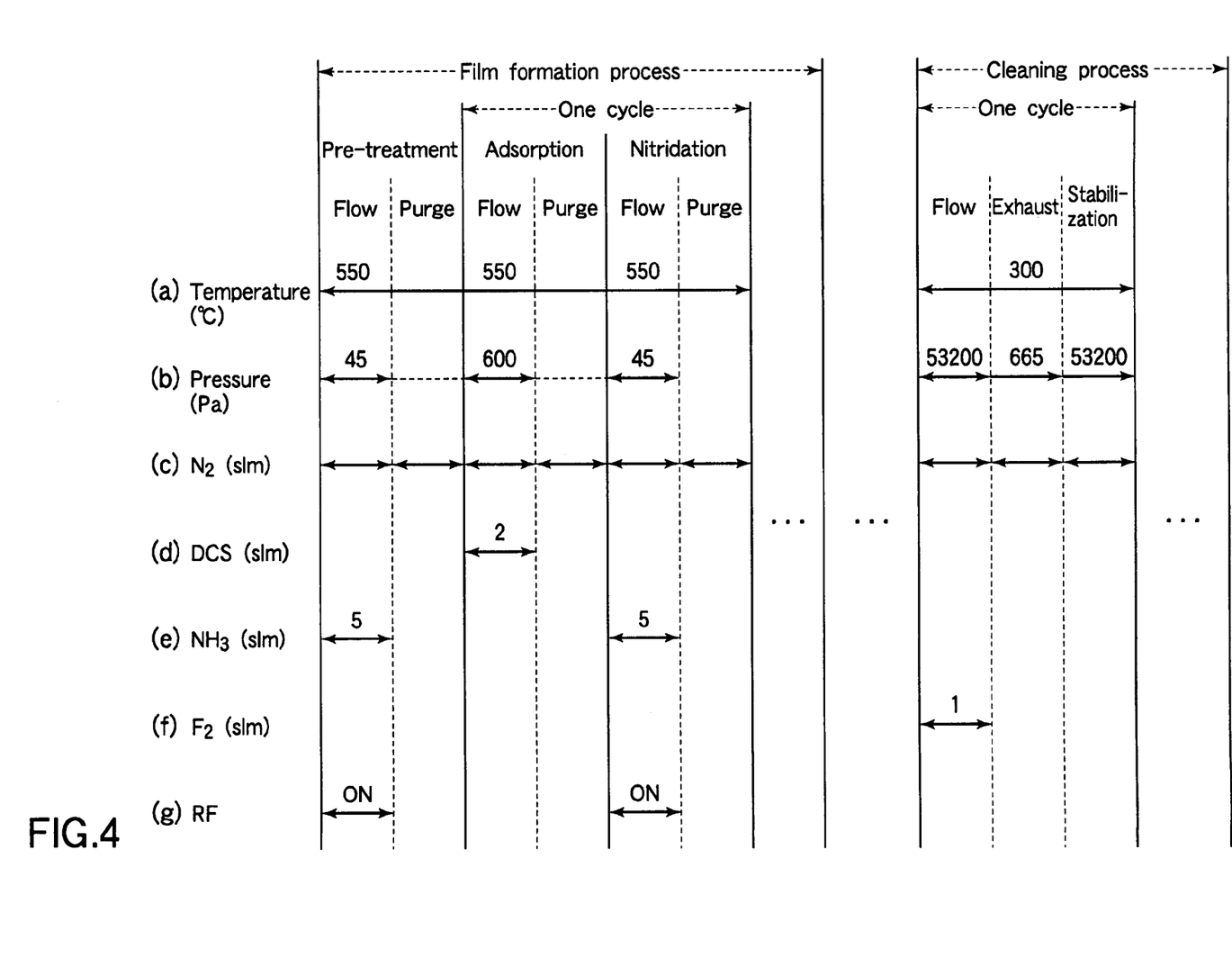
FIG. 4 is a timing chart showing the recipe of a film formation process and a cleaning process according to the embodiment of the present invention.

Next, an explanation will be given of a method for using the film formation apparatus 1 described above, with reference to FIG. 4. In outline, at first, a film formation process is performed to form a silicon nitride film on semiconductor wafers W inside the reaction tube 2. Then, a cleaning process is performed to remove a by-product film, which contains silicon nitride as the main component (it means 50% or more), deposited inside the plasma generation section 10. FIG. 4 is a timing chart showing the recipe of a film formation process and a cleaning process according to the embodiment of the present invention.

The respective components of the film formation apparatus 1 described below are operated under the control of the control section 100 (CPU 115). The temperature and pressure inside the reaction tube 2 and the gas flow rates during the processes are set in accordance with the recipe shown in FIG. 4, while the control section 100 (CPU 115) controls the heater controller 124 (for the heater 7), MFC controllers 125 (for the gas distribution nozzles 8 and 9 and gas nozzle 16), valve controllers 126, and vacuum pump 127, as described above.

<Film Formation Process>

At first, the wafer boat 6 at room temperature, which supports a number of, e.g., 50 to 100, wafers having a diameter of 300 mm, is loaded into the reaction tube 2 heated at a predetermined temperature, and the reaction tube 2 is airtightly closed. Then, the interior of the reaction tube 2 is vacuum-exhausted and kept at a predetermined process pressure, and the wafer temperature is increased to a process temperature for film formation. At this time, the apparatus is in a waiting state until the pressure and temperature become stable. Then, a pre-treatment stage is performed to treat the surface of the wafers W by ammonia radicals, as described below. During the film formation process comprising the pre-treatment stage as well as adsorption and nitridation stages alternately repeated thereafter, the wafer boat 6 is preferably kept rotated by the rotary table.

In the pre-treatment stage, at first, nitrogen gas is supplied into the reaction tube 2 at a predetermined flow rate, as shown in FIG. 4, (c). Further, the reaction tube 2 is set at a predetermined temperature, such as 550° C., as shown in FIG. 4, (a). At this time, the reaction tube 2 is exhausted to set the reaction tube 2 at a predetermined pressure, such as 45 Pa (0.34 Torr: 133 Pa=1 Torr), as shown in FIG. 4, (b). These operations are continued until the reaction tube 2 is stabilized at the predetermined pressure and temperature.

When the reaction tube 2 is stabilized at the predetermined pressure and temperature, an RF power is applied between the electrodes 11 (RF: ON), as shown in FIG. 4, (g). Further, ammonia gas is supplied to a position between the electrodes 11 (inside the plasma generation section 10) at a predetermined flow rate, such as 5 slm (standard liter per minute), as shown in FIG. 4, (e). Ammonia gas thus supplied is excited (activated) into plasma between the electrodes 11 (inside the plasma generation section 10) and generates ammonia radicals. The radicals thus generated are supplied from the plasma generation section 10 into the reaction tube 2. Further, nitrogen gas is also supplied from the gas distribution nozzle 9 into the reaction tube 2 at a predetermined flow rate, as shown in FIG. 4, (c) (flow step).

In the pre-treatment stage, when the pre-treatment is performed on the surface of the wafers W by ammonia radicals, —OH groups and —H groups present on the surface of the wafers W are partly replaced with —NH$_2$ groups. Accordingly, when the adsorption stage performed thereafter is started, —NH$_2$ groups are present on the surface of the wafers W. When DCS is supplied in this state, the DCS is thermally activated and reacts with —NH$_2$ groups on the surface of the wafers W, thereby accelerating adsorption of Si on the surface of the wafers W.

After ammonia gas is supplied for a predetermined time period, the supply of ammonia gas is stopped and the application of RF power is stopped. On the other hand, nitrogen gas is kept supplied into the reaction tube 2 at a predetermined flow rate, as shown in FIG. 4, (c). Further, the reaction tube 2 is exhausted to exhaust gas from inside the reaction tube 2 (purge step).

It should be noted that, in light of the film formation sequence, the temperature inside the reaction tube 2 is preferably set to be constant during the film formation. Accordingly, in this embodiment, the temperature inside the reaction tube 2 is set at 550° C. over the pre-treatment, adsorption, and nitridation stages. Further, the reaction tube 2 is kept exhausted over the pre-treatment, adsorption, and nitridation stages.

In the adsorption stage subsequently performed, at first, while nitrogen gas is supplied into the reaction tube 2 at a predetermined flow rate, as shown in FIG. 4, (c), the reaction tube 2 is set at a predetermined temperature, such as 550° C., as shown in FIG. 4, (a). At this time, the reaction tube 2 is exhausted to set the reaction tube 2 at a predetermined pressure, such as 600 Pa (4.6 Torr), as shown in FIG. 4, (b). These operations are continued until the reaction tube 2 is stabilized at the predetermined pressure and temperature.

When the reaction tube 2 is stabilized at the predetermined pressure and temperature, DCS gas is supplied into the reaction tube 2 at a predetermined flow rate, such as 2 slm, as shown in FIG. 4, (d), and nitrogen gas is also supplied into the reaction tube 2 at a predetermined flow rate, as shown in FIG. 4, (c) (flow step). DCS gas thus supplied into reaction tube 2 is heated and thereby activated in the reaction tube 2, and reacts —NH$_2$ groups present on the surface of the wafers W to form an adsorption layer containing Si on the surface of the wafers W.

After DCS gas is supplied for a predetermined time period, the supply of DCS gas is stopped. On the other hand, nitrogen gas is kept supplied into the reaction tube 2 at a predetermined flow rate, as shown in FIG. 4, (c). Further, the reaction tube 2 is exhausted to exhaust gas from inside the reaction tube 2 (purge step).

In the nitridation stage subsequently performed, at first, while nitrogen gas is supplied into the reaction tube 2 at a predetermined flow rate, as shown in FIG. 4, (c), the reaction tube 2 is set at a predetermined temperature, such as 550° C., as shown in FIG. 4, (a). At this time, the reaction tube 2 is exhausted to set the reaction tube 2 at a predetermined pressure, such as 45 Pa (0.34 Torr), as shown in FIG. 4, (b). These operations are continued until the reaction tube 2 is stabilized at the predetermined pressure and temperature.

When the reaction tube 2 is stabilized at the predetermined pressure and temperature, an RF power is applied between the electrodes 11 (RF: ON), as shown in FIG. 4, (g). Further, ammonia gas is supplied to a position between the electrodes 11 (inside the plasma generation section 10) at a predetermined flow rate, such as 5 slm, as shown in FIG. 4, (e). Ammonia gas thus supplied is excited (activated) into plasma between the electrodes 11 and generates radicals containing nitrogen atoms (N*, NH*, NH$_2$*, NH$_3$*). The radicals containing nitrogen atoms thus generated are supplied from the plasma generation section 10 into the reaction tube 2. Further, nitrogen gas is also supplied from the gas distribution nozzle 9 into the reaction tube 2 at a predetermined flow rate, as shown in FIG. 4, (c) (flow step).

The radicals flow out from the opening 10b of the plasma generation section 10 toward the center of the reaction tube 2, and are supplied into gaps between the wafers W in a laminar flow state. When radicals containing nitrogen atoms are supplied onto the wafers W, they react with Si in the adsorption layer on the wafers W, and a thin film of silicon nitride is thereby formed on the wafers W.

After ammonia gas is supplied for a predetermined time period, the supply of ammonia gas is stopped and the application of RF power is stopped. On the other hand, nitrogen gas is kept supplied into the reaction tube 2 at a predetermined flow rate, as shown in FIG. 4, (c). Further, the reaction tube 2 is exhausted to exhaust gas from inside the reaction tube 2 (purge step).

As described above, the film formation method according to this embodiment is arranged to alternately repeat a cycle comprising adsorption and nitridation stages in this orders a predetermined number of times. In each cycle, DCS is supplied onto the wafers W to form an adsorption layer, and then radicals containing nitrogen atoms are supplied to nitride the adsorption layer, so as to form a silicon nitride film. As a result, a silicon nitride film of high quality can be formed with high efficiency.

When the silicon nitride film formed on the surface of the semiconductor wafers W reaches a predetermined thickness, the wafers W are unloaded. Specifically, nitrogen gas is supplied into the reaction tube 2 at a predetermined flow rate, so that the pressure inside the reaction tube 2 is returned to atmospheric pressure, and the reaction tube 2 is set at a predetermined temperature. Then, the lid 18 is moved down by the boat elevator 25, and the wafer boat 6 is thereby unloaded out of the reaction tube 2, along with the wafers W.

<Cleaning Process>

Repeating this film formation process a plurality of times, silicon nitride produced by the film formation process is deposited (adhered) not only on the surface of semiconductor wafers W, but also on the inner surface of the reaction tube 2 and so forth, as by-product films. Particularly, a by-product film can be easily deposited inside the plasma generation section 10. Accordingly, after the film formation process is repeated a predetermined number of times, a local cleaning process is performed inside the plasma generation section 10, which requires removal of the by-product film most, by use of conditions optimum to removal of this by-product film. Although by-product films are deposited on other portions, such as the inner surface of the reaction tube 2, where the local cleaning process for removing the by-product film deposited inside the plasma generation section 10 is performed, the frequency of performing the entire cleaning process for the entirety inside the reaction chamber can be set lower.

As shown in FIG. 4, in the local cleaning process according to this embodiment, one cycle comprises a flow step, an exhaust step, and a stabilization step. This cycle is repeated a plurality of times to remove the by-product film deposited inside the plasma generation section 10. By doing so, the cleaning process according to this embodiment can gradually remove the by-product film cycle by cycle inside the plasma generation section 10, so that the by-product film deposited inside the plasma generation section 10 is preferentially removed.

At first, the reaction tube 2 is heated by the heater 7 at a predetermined load temperature, and nitrogen gas is supplied into the reaction tube 2 at a predetermined flow rate. Then, the lid 5 with no wafer boat 6 placed thereon is moved up by the boat elevator 128, so that the reaction tube 2 is airtightly closed.

Then, nitrogen gas is supplied from the gas distribution nozzle 8 into the reaction tube 2 at a predetermined flow rate, as shown in FIG. 4, (c). Further, the interior of the reaction tube 2 (along with the interior of the plasma generation section 10) is heated by the heater 7 to a predetermined temperature, such as 300° C., as shown in FIG. 4, (a). At this time, the interior of the reaction tube 2 (along with the interior of the plasma generation section 10) is exhausted to set the interior of the reaction tube 2 (along with the interior of the plasma generation section 10) at a predetermined pressure, such as 53,200 Pa (400 Torr), as shown in FIG. 4, (b). Then, fluorine gas is supplied from the gas distribution nozzle 8 into the plasma generation section 10 at a predetermined flow rate, such as 1 slm, as shown in FIG. 4, (f), for a predetermined time, such as, 1 minute (flow step). At this time, a mixture of the fluorine gas with a predetermined amount of nitrogen gas is supplied from the gas distribution nozzle 8. Further, a small amount of nitrogen gas is also supplied from each of the gas distribution nozzle 9 and gas nozzle 16 into the reaction tube 2.

In this step, the temperature inside the reaction tube 2 is preferably set at a value of 200 to 400° C. If the cleaning temperature is lower than 200° C., activation of the cleaning gas (fluorine) is insufficient, and so the etching rate of the cleaning gas for silicon nitride may be lower than the necessary value. If the cleaning temperature is higher than 400° C., the etching rate for quartz that forms the plasma generation section 10 may become too high and deteriorate the etching selectivity.

The pressure inside the reaction tube 2 is preferably set at a value of 13,300 Pa (100 Torr) to 66,500 Pa (500 Torr). Where this range is used, the etching rate for silicon nitride is high while the etching rate for quartz is not so high, and so the by-product film deposited inside the plasma generation section 10 can be easily removed.

The flow rate and supply time of fluorine gas supplied from the gas distribution nozzle 8 are set to prevent the fluorine gas supplied into the plasma generation section 10 from flowing into the reaction tube 2. The preferable ranges of the flow rate and supply time differ depending on the size of the plasma generation section 10 and the volume of the by-product film deposited inside the plasma generation section 10. However, for example, the flow rate of the fluorine gas is preferably set at a value of 0.1 to 3 slm and the supply time of the fluorine gas is preferably set at a value of 10 seconds to 2 minutes.

When the cleaning gas is supplied into the plasma generation section 10, the cleaning gas is heated, and fluorine is activated, thereby forming a state in which a number of reactive free atoms are present. The activated fluorine comes into contact with (reacts with) the by-product film deposited on the inner surface of the plasma generation section 10 and so forth, and etches the by-product film.

After cleaning gas is supplied into the plasma generation section 10 for a predetermined time period, the supply of fluorine gas is stopped and nitrogen gas is supplied from the gas distribution nozzle 8 at a predetermined flow rate. Further, gas is exhausted by the exhaust section GE from inside the plasma generation section 10 and reaction tube 2 to remove the fluorine gas from inside the plasma generation section 10 (exhaust step). The exhaust step is conceived to completely remove fluorine gas used as a cleaning gas from inside the plasma generation section 10 and reaction tube 2.

Figure 5:
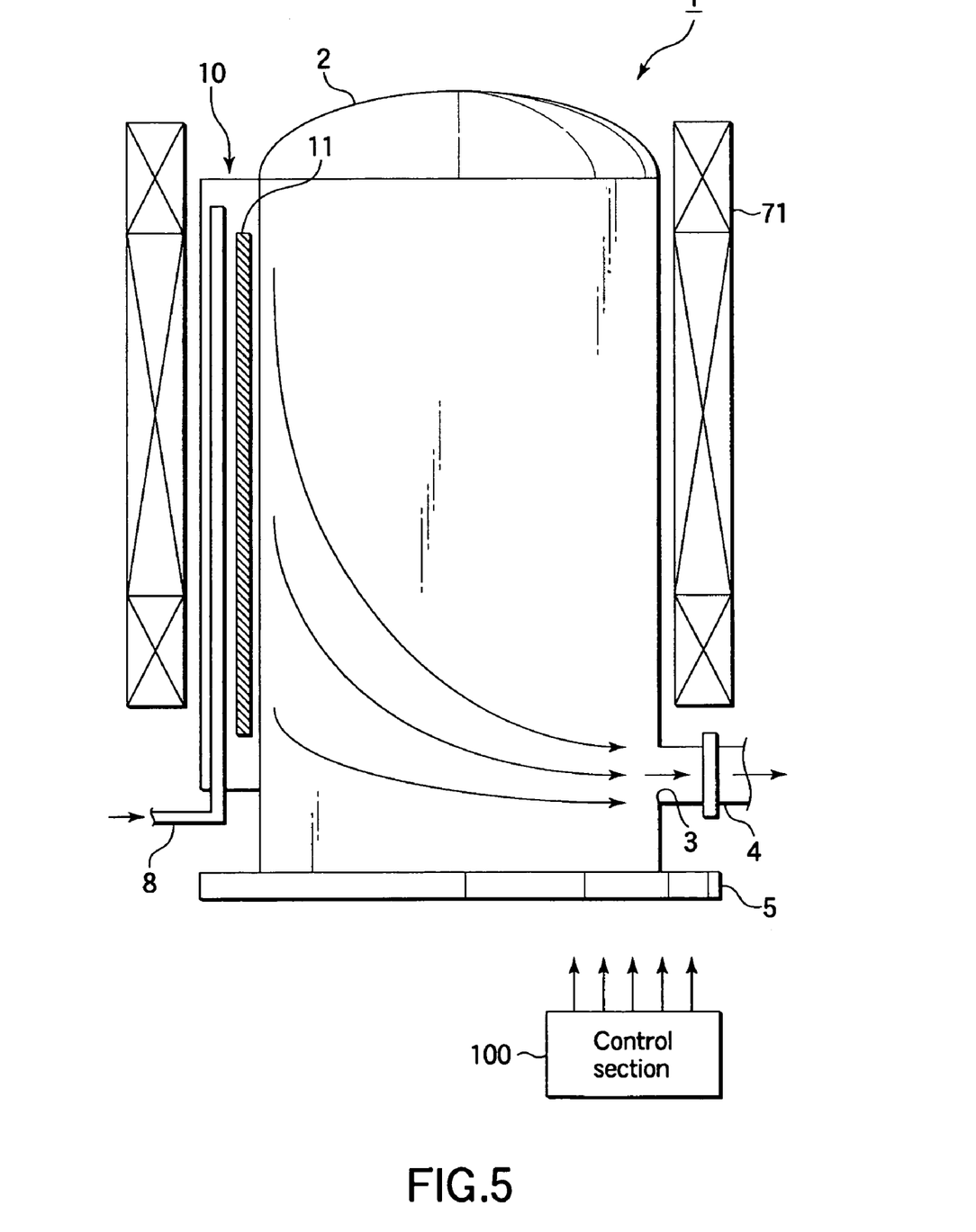
FIG. 5 is a view showing gas flows inside the reaction tube in the cleaning process.

In the exhaust step, the pressure inside the reaction tube 2 is preferably gradually decreased, so that the pressure inside the reaction tube 2 (plasma generation section 10) reaches a value of 0.133 Pa (1 mTorr) to 1,330 Pa (10 Torr). For example, at this time, the pressure inside the reaction chamber 2 is decreased at a pressure decrease rate of 133 to 798 Pa/sec (1 to 6 Torr/sec), and preferably of 266 to 399 Pa/sec (2 to 3 Torr/sec). Where the pressure is gradually decreased in this way, the fluorine gas is easily caused to flow from the plasma generation section 10 into the exhaust port 3, as shown in FIG. 5. In this case, the fluorine gas from the plasma generation section 10 is prevented from reacting with by-product films deposited inside the reaction tube 2. In this embodiment, the pressure inside the reaction tube 2 is gradually decreased until the pressure inside the reaction tube 2 (plasma generation section 10) reaches 665 Pa (5 Torr), as shown in FIG. 4, (b).

After the pressure inside the reaction tube 2 reaches 665 Pa, the amount of nitrogen gas supplied from the gas distribution nozzle 9 and gas nozzle 16 is increased while a predetermined amount of nitrogen gas is supplied from the gas distribution nozzle 8, so that the pressure inside the reaction tube 2 is increased. When the pressure inside the reaction tube 2 returns to the pressure of the flow step, such as 53,200 Pa (400 Torr), the pressure inside the reaction tube 2 is maintained while gas is exhausted from inside the reaction tube 2 (stabilization step). The stabilization step is conceived not only to stabilize the pressure and gas flow, but also to form a barrier of nitrogen gas inside the reaction tube 2. This nitrogen gas barrier prevents fluorine gas supplied into the plasma generation section 10 in the subsequent cycle from being diffused into the reaction tube 2. Consequently, the fluorine gas from the plasma generation section 10 is prevented from reacting with by-product films deposited inside the reaction tube 2. Consequently, the cleaning process is preferentially performed on the by-product film deposited inside the plasma generation section 10.

One cycle (cycle 1) of the cleaning process is finished by the steps described above. This cycle is repeated a predetermined number of times, such as 150 to 300 times to complete the cleaning process, thereby removing the by-product film deposited inside the plasma generation section 10. In this way, where the by-product film deposited inside the plasma generation section 10 is gradually removed cycle by cycle, the by-product film deposited inside the plasma generation section 10 is preferentially removed, and the cleaning process is efficiently performed.

After the cleaning process is completed, nitrogen gas is supplied from the gas distribution nozzle 9 into the reaction tube 2 at a predetermined flow rate, so that the pressure inside the process tube 2 is returned to atmospheric pressure. Further, the temperature inside the reaction tube 2 is maintained by the heater 7 at a predetermined value. Then, the lid 5 is moved down by the boat elevator 128, and the reaction tube 2 is thereby opened. Thereafter, the wafer boat 6 with a new lot of semiconductor wafers W mounted thereon is placed on the lid 5, and the film formation process is started again in the manner described above.

<Experiment>

An experiment was conducted to examine removal of a by-product film deposited inside the generation section 10 by performing a film formation process and a cleaning process in the film formation apparatus 1 shown in FIGS. 1 and 2. Specifically, the film formation process shown in FIG. 4 was performed to form a silicon nitride film on semiconductor wafers W, wherein reaction products, such as silicon nitride, were deposited inside the plasma generation section 10 and reaction tube 2 as by-product films. Then, the cleaning process shown in FIG. 4 was performed to remove the by-product film deposited inside the plasma generation section 10. After the cleaning process, the surfaces of the walls of the plasma generation section 10 and reaction tube 2 were observed by use of pictures taken through a microscope. As a result, the by-product film deposited on the wall of the plasma generation section 10 had been removed, but the by-product films deposited on the wall of the reaction tube 2 were still present. Hence, it has been confirmed that the method according to this embodiment can preferentially remove the by-product film deposited inside the plasma generation section 10.

<Consequence and Modification>

As described above, according to this embodiment, the by-product film deposited inside the plasma generation section 10 is gradually removed cycle by cycle. Further, the operation subsequent to the flow step (etching step) is performed with two steps, i.e., the exhaust step and stabilization step, so that the fluorine gas from the plasma generation section 10 is prevented from reacting with by-product films deposited inside the reaction tube 2. Consequently, the by-product film deposited inside the plasma generation section 10 is preferentially removed. Since this local cleaning process can be efficiently performed in a short time, and the frequency of performing the entire cleaning process for the entirety inside the reaction chamber can be set lower, it is possible to improve the throughput of the apparatus. Further, the local cleaning process can be arranged to set the cleaning gas composition and process conditions in accordance with the target by-product film. Consequently, this by-product film is reliably removed, and the particle generation is thereby suppressed.

In the embodiment described above, the operation subsequent to the flow step (etching step) is performed with two steps, i.e., the exhaust step and stabilization step, but the exhaust step may be solely used to remove the fluorine gas from inside the plasma generation section 10. Also in this case, a by-product film deposited inside the plasma generation section 10 is gradually removed cycle by cycle, so that the by-product film deposited inside the plasma generation section 10 is preferentially removed.

Figure 6:
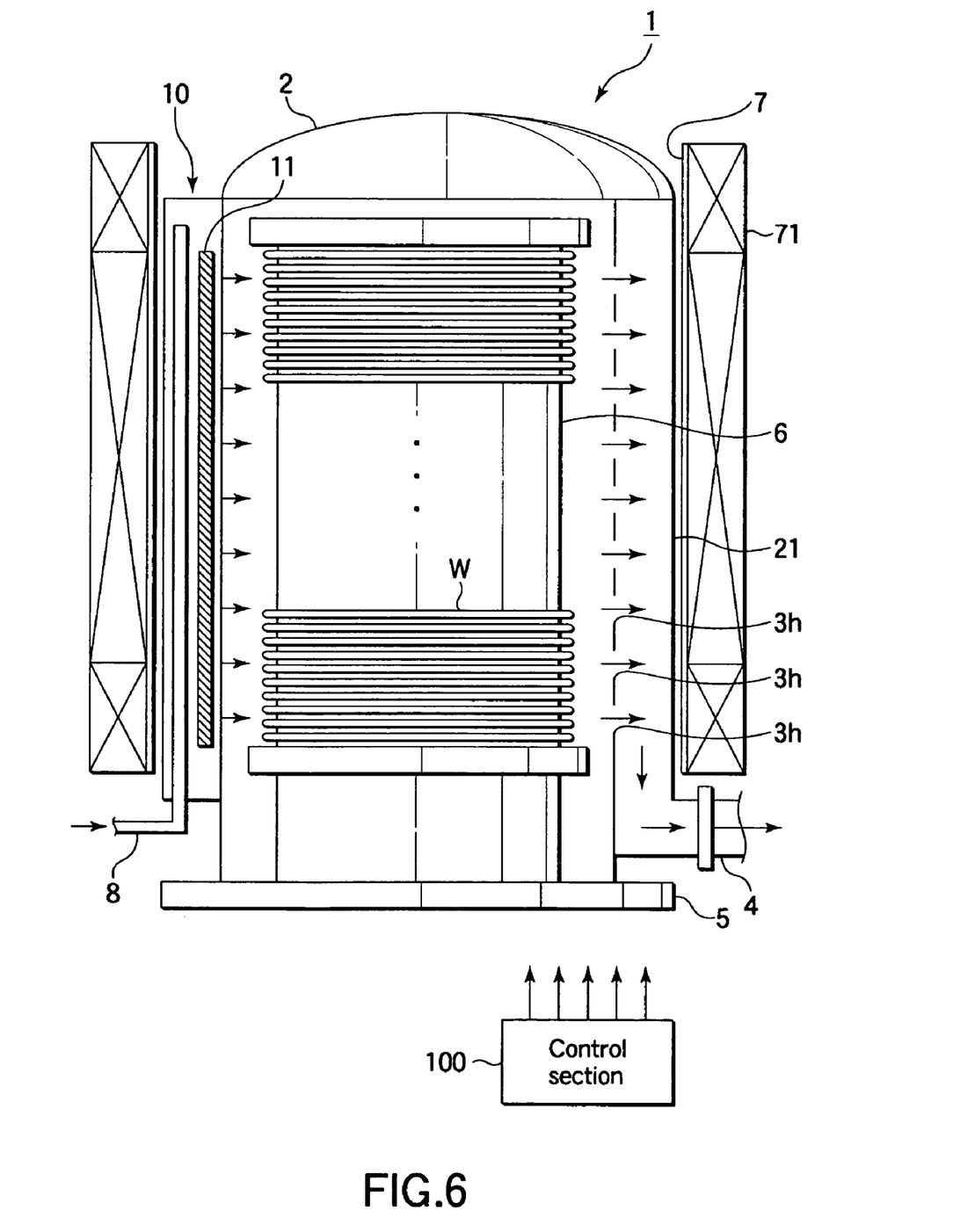
FIG. 6 is a sectional view showing a film formation apparatus (vertical CVD apparatus) according to a modification of the embodiment.

In the embodiment described above, the film formation apparatus 1 has the exhaust port 3 formed on the sidewall near the bottom, and gas flows from the process space directly into the exhaust port 3. Alternatively, for example, as shown in FIG. 6, the film formation apparatus 1 may be provided with an exhaust space 21 on one side of the reaction tube 2 for exhausting gas from inside the reaction tube 2, such that a plurality of exhaust holes 3h are formed in the partition wall between the process space and exhaust space 21. Also in this case, a by-product film deposited inside the plasma generation section 10 is gradually removed cycle by cycle, so that the by-product film deposited inside the plasma generation section 10 is preferentially removed. Alternatively, the present invention may be applied to a horizontal film formation apparatus of the batch type or a film formation apparatus of the single-substrate type.

In the embodiment described above, an MLD method is used to form a silicon nitride film, but a thermal CVD method may be used to form a silicon nitride film, for example. In the embodiment described above, the film formation apparatus 1 includes the plasma generation section 10. Alternatively, the present invention may be applied to a film formation apparatus including a gas activation section that utilizes another medium, such as a catalyst, UV, heat, or magnetic force. In the embodiment described above, the film formation apparatus 1 is designed to form a silicon nitride film. Alternatively, the present invention may be applied to a film formation apparatus designed to form another thin film, such as a silicon oxide film, silicon oxynitride film, or poly-silicon film.

In the embodiment described above, nitrogen gas is supplied as a dilution gas when each of the film formation gases, such as DCS gas, is supplied. In this respect, no nitrogen gas may be supplied when each of the film formation gases is supplied. However, each of the film formation gases preferably contains nitrogen gas as a dilution gas, because the process time can be more easily controlled if it is so arranged. The dilution gas consists preferably of an inactive gas, such as nitrogen gas, or helium gas (He), neon gas (Ne), argon gas (Ar), or xenon gas (Xe) in place of nitrogen gas.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for using a film formation apparatus for a semiconductor process to form a silicon-containing thin film selected from the group consisting of a silicon nitride film, a silicon oxide film, and a silicon oxynitride film, the film formation apparatus comprising a reaction chamber with a process space formed therein and configured to accommodate a plurality of target substrates at intervals in a vertical direction, a support member configured to support the target substrates inside the process space, an exhaust system configured to exhaust gas from inside the reaction chamber, a heater disposed around the reaction chamber to heat the target substrates, a plasma generation section attached outside the reaction chamber and forming a plasma generation space communicating with the process space inside the reaction chamber, a first film formation gas supply system configured to supply a first film formation gas containing a silicon source gas into the process space not through the plasma generation space, a second film formation gas supply system configured to supply a second film formation gas containing a reactive gas into the process space through the plasma generation space, a first inactive gas supply system configured to supply a first inactive gas into the process space not through the plasma generation space, a second inactive gas supply system configured to supply a second inactive gas directly into the plasma generation space, and a cleaning gas supply system configured to supply a cleaning gas directly into the plasma generation space, the cleaning gas containing fluorine for etching a by-product film generated by a reaction between the first and second film formation gases and deposited inside the plasma generation section, the method comprising:

performing a film formation process for forming the silicon-containing thin film by CVD on a first lot of product target substrates inside the process space, by supplying the first film formation gas from the first film formation gas supply system into the process space and supplying the second film formation gas from the second film formation gas supply system into the process space while activating the second film formation gas by the plasma generation section;

then, performing a cleaning process to remove a by-product film deposited inside the plasma generation section, in a state where no product target substrates are accommodated inside the process space; and then, performing the film formation process for forming the silicon-containing thin film by CVD on a second lot of product target substrates inside the process space, wherein the cleaning process repeats a cleaning cycle a plurality of times, the cleaning cycle including, in the following order, an etching step of supplying the cleaning gas from the cleaning gas supply system directly into the plasma generation space and supplying the first inactive gas from the first inactive gas supply system directly into the process space, thereby etching the by-product film inside the plasma generation section by the cleaning gas while preventing the cleaning gas from flowing from the plasma generation space into the process space, the etching step being started by setting a first pressure inside the reaction chamber, an exhaust step of exhausting gas by the exhaust system from inside the plasma generation space, while supplying the second inactive gas from the second inactive gas supply system directly into the plasma generation section without supplying the cleaning gas, the exhaust step gradually decreasing pressure inside the reaction chamber from the first pressure to a second pressure by exhausting gas from inside the plasma generation space through the process space to the exhaust system, and, a stabilization step of supplying the first inactive gas from the first inactive gas supply system without supplying the cleaning gas, thereby returning pressure inside the reaction chamber from the second pressure to the first pressure and forming a barrier of the first inactive gas inside the process space to prevent the cleaning gas to be subsequently supplied from diffusing from the plasma generation space into the process space.

2. The method according to claim 1, wherein the film formation process is arranged to alternately supply the first and second film formation gases into the process space.

3. The method according to claim 1, wherein the second inactive gas supply system and the cleaning gas supply system employ a nozzle common to the second film formation gas supply system disposed inside the plasma generation section.

4. The method according to claim 1, wherein the second pressure is set at a value of 0.133 to 1,330 Pa.

5. The method according to claim 4, wherein the silicon-containing thin film is a silicon nitride film, the reaction chamber has an inner surface consisting of quartz, and the first pressure is set at a value of 13,300 to 66,500 Pa.

6. The method according to claim 5, wherein the exhaust step decreases the pressure inside the reaction chamber at a pressure decrease rate of 133 to 798 Pa/sec.

7. The method according to claim 1, wherein the etching step activates the cleaning gas by heating the plasma generation space to a temperature of 200 to 400° C. by use of heat of the heater.

8. The method according to claim 1, wherein the first and second inactive gases are the same inactive gas.

9. The method according to claim 1, wherein the first and second inactive gases are nitrogen gas.

10. The method according to claim 5, wherein the reactive gas contained in the second film formation gas is ammonia gas.

11. The method according to claim 1, wherein the silicon source gas contained in the first film formation gas is a silane family gas.

12. The method according to claim 1, wherein the cleaning process repeats the cleaning cycle 150 to 300 times.

* * * * *